United States Patent
Petcavich et al.

(10) Patent No.: US 11,550,433 B2
(45) Date of Patent: Jan. 10, 2023

(54) METHOD FOR PHOTOLITHOGRAPHY TO MANUFACTURE A TWO-SIDED TOUCH SENSOR

(71) Applicant: FUTURETECH CAPITAL, INC., Palo Alto, CA (US)

(72) Inventors: Robert Petcavich, The Woodlands, TX (US); Robert Routh, Latham, NY (US); Michael Morrione, Jackson, CA (US)

(73) Assignee: FUTURETECH CAPITAL, INC., Palo Alto, CA (US)

( * ) Notice: Subject to any disclaimer, the term of this patent is extended or adjusted under 35 U.S.C. 154(b) by 81 days.

(21) Appl. No.: 16/848,400

(22) Filed: Apr. 14, 2020

(65) Prior Publication Data

US 2021/0318769 A1   Oct. 14, 2021

(51) Int. Cl.
*G06F 3/044* (2006.01)
*H05K 3/06* (2006.01)
*G06F 3/045* (2006.01)

(52) U.S. Cl.
CPC .............. *G06F 3/044* (2013.01); *G06F 3/045* (2013.01); *H05K 3/064* (2013.01); *G06F 2203/04103* (2013.01); *G06F 2203/04112* (2013.01); *H05K 2203/0783* (2013.01)

(58) Field of Classification Search
None
See application file for complete search history.

(56) References Cited

U.S. PATENT DOCUMENTS

2015/0370284 A1* 12/2015 Bauer ................. C09D 11/107
                                                345/174
2016/0291478 A1* 10/2016 Petcavich ............... G03F 7/162

OTHER PUBLICATIONS

"Cationic UV Adhesives Laminate Opaque Films via Dark-Cure," Oct. 5, 2000, Adhesives & Sealants Industry, "https://www.adhesivesmag.com/articles/85786-cationic-uv-adhesives-laminate-opaque-films-via-dark-cure" (Year: 2000).*

* cited by examiner

*Primary Examiner* — Stephen T. Reed
(74) *Attorney, Agent, or Firm* — Womble Bond Dickinson (US) LLP; Joseph Bach, Esq.

(57) ABSTRACT

A touch sensor having conductive circuits on both surfaces of a substrate is fabricated by including UV-blocking material into the substrate or depositing UV-blocking layer on the substrate. This can be used for fabricating sensors having transparent conductor circuits, or having metallic circuits, which are opaque to visible light. Photoresist is applied to both surfaces of the substrate and patterns are transferred to the photoresist by exposure to UV radiation. The UV-blocking layer prevents UV-radiation applied to one side from exposing the opposite side. If desired, both photoresist layers may be exposed simultaneously by splitting one UV beam.

17 Claims, 5 Drawing Sheets

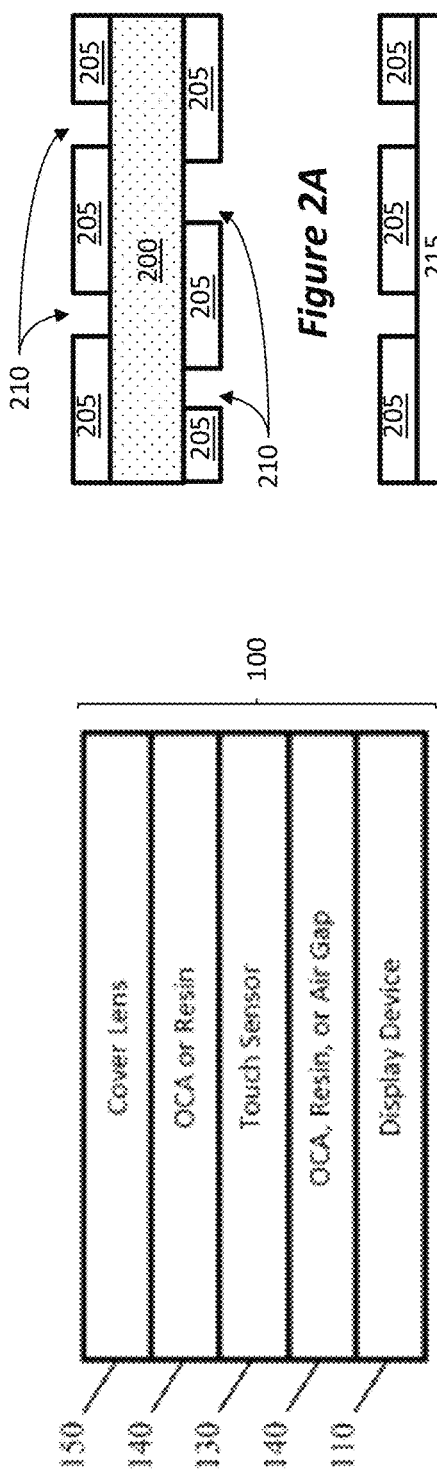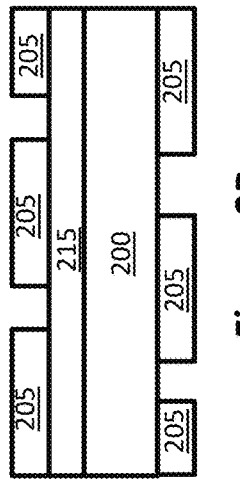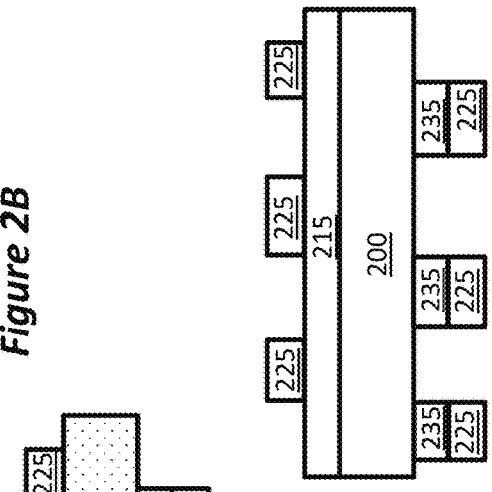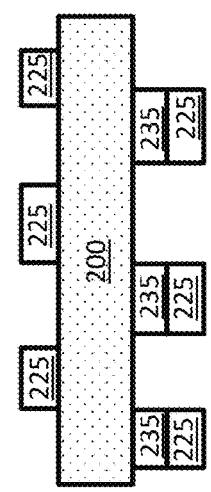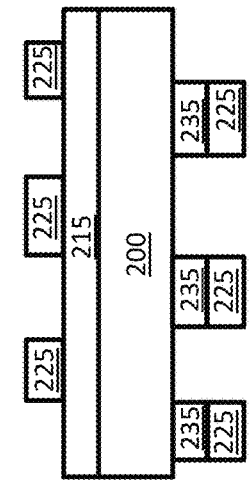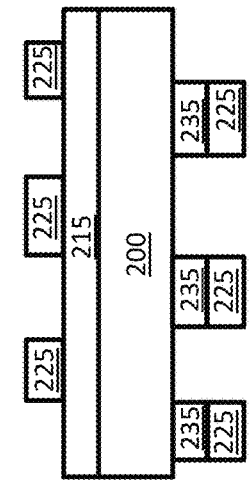

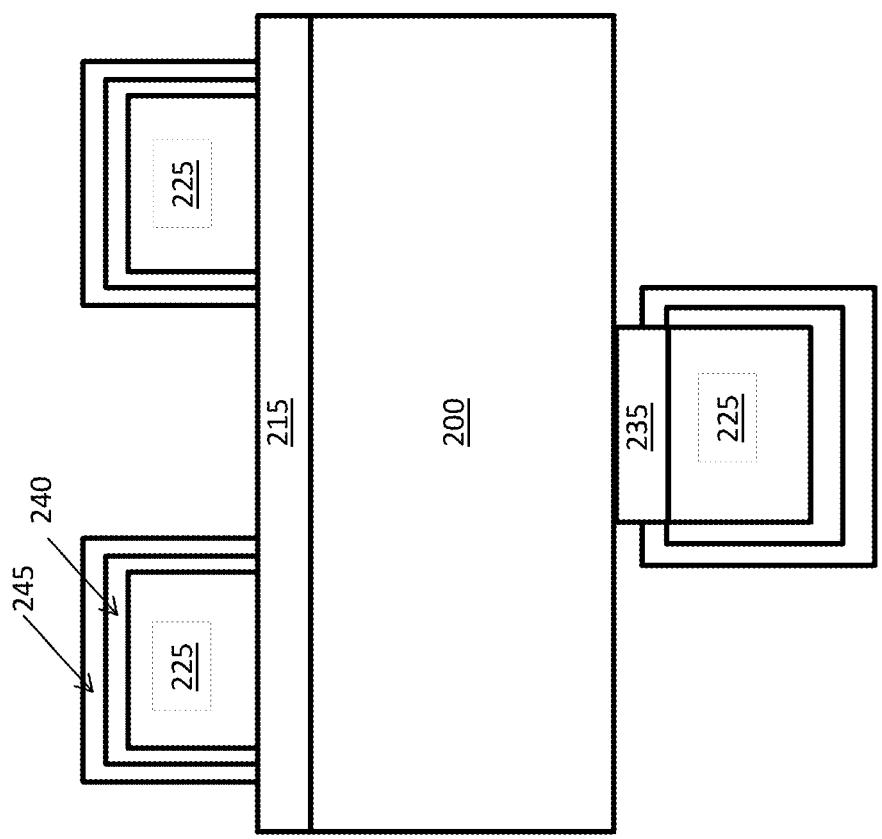

METHOD FOR PHOTOLITHOGRAPHY TO MANUFACTURE A TWO-SIDED TOUCH SENSOR

TECHNICAL FIELD

Embodiments of the present disclosure relate generally to touch screen enabled systems. More particularly, embodiments of the disclosure relate to touch sensors with conductive micro-mesh.

BACKGROUND

A touch screen enabled system allows a user to control various aspects of the system by finger touch or stylus on the screen. A user may interact directly with one or more objects depicted on a display device by touch or stylus that are sensed by a touch sensor. The touch sensor typically includes a conductive pattern disposed on a substrate configured to sense touch. Touch screens are commonly used in consumer, commercial, and industrial systems.

For touch screen applications that require precise alignment of circuits on two sides of a transparent substrate, a two-sided photolithographic method may be used to simultaneously photolithographically pattern the circuits. However, given the optically transparent nature of the substrate and certain conductor materials like indium-tin-oxide (ITO), it is usually not possible given that light used to expose one side of the material will also expose the other side. Instead of a unique pattern on only one side of the substrate, the same pattern will appear on the opposite side as well.

One method to solve this issue is to use two separate substrates. Expose the unique pattern on the individual substrate, align the two patterned substrates and join the substrates with an optical clear adhesive layer. Several disadvantages with this approach are the cost of additional substrates, the additional thickness of the second substrate and adhesive layer and difficulty maintaining precise alignment between the patterns on the individual substrates.

An alternative method using a single substrate has been proposed, by selecting specific substrate and photosensitive material and exposure light wavelength that do not overlap. For example, selecting a substrate material that does not transmit light below 375 nm, selecting a photosensitive material that is sensitive to 365 nm, and using a light source that emits at 365 nm and filter out all wavelengths above 370 nm. In this case the substrate is opaque to the filtered light source and light will not reach the opposite surface. The photosensitive material will respond to the filtered light source wavelength. A unique pattern can be simultaneously applied to each side of the substrate. The main disadvantage of this approach is that many desirable substrates for touch sensor applications such COP (Cyclo Olefin Polymer) and PET (polyethylene terephthalate) will transmit light down to 315 nm. There are photosensitive materials that respond to wavelengths below 315 nm, however they trade off other properties, such as resistance to further chemical process and adhesion to the substrate and mechanical strength. Exposure light sources are also available below 315 nm however they tend to be expensive and the optical elements required to structure the light from the exposure source also become expensive and specialized.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Disclosed herein is a method for manufacturing a touch sensor with a low visibility conductive circuit on both sides of a substrate. The method provides solutions for touch screen applications that require circuits on two sides of a transparent substrate. In some embodiments, a UV absorbing layer is applied to one surface of a transparent substrate. The photosensitive material is then applied on the UV absorbing layer on one side and directly on the substrate surface on an opposing side. The UV absorbing layer may be tuned to block the UV frequency from activating the photoresist.

In an aspect of the disclosure, a method of manufacturing a touch sensor with a conductive circuit on both sides of a substrate is provided. The method comprises applying a UV-blocking layer to a first surface of a transparent substrate of a touch sensor, applying a first photoresist layer over the UV-blocking layer and applying a second photoresist layer over a second surface of the transparent substrate, patterning the first photoresist layer and the second qphotoresist layer to generate a first patterned layer and a second patterned layer, and forming conductive lines over the first patterned layer and the second patterned layer. In an embodiment, a standoff photoresist layer may be applied on the UV-blocking layer, the second surface, or both, prior to applying the first photoresist layer and the second photoresist layer. In embodiments, forming conductive lines may comprise depositing a transparent conductor lines, such as, e.g., indium-tin-oxide (ITO) or antimony tin oxide (ATO). In embodiments, the first and second photoresist layers may comprise a catalytic photoresist composition. In embodiments, forming conductive lines may comprise plating a metal layer on the first and second patterned layers, wherein the metal layer is made of metallic material that is opaque in the visible spectrum. In embodiments, the method may further comprise applying a metal passivation layer over the metal layer.

In an aspect of the disclosure, a touch sensor with a conductive micro-mesh is disclosed. The touch sensor comprises a transparent substrate, a UV-blocking layer deposited on a first surface of a transparent substrate. Also, optionally a first layer of photoresist patterns may be formed over the UV-blocking layer and a second layer of photoresist may be formed on a second surface of the transparent substrate. The touch sensor further comprises conductive patterns. In embodiments, a photoresist standoff layer may be formed on the UV-blocking layer below the photoresist layer or on the opposite surface of the substrate. In embodiments, the photoresist layer may be a catalytic photoresist composition. In embodiments, the conductive patterns may comprise indium-tin-oxide (ITO) or antimony tin oxide (ATO) lines. In embodiments, the conductive patterns may comprise metal such as copper or copper alloy. The touch sensor further comprises a metal passivation layer over the metal.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

Embodiments of the disclosure are illustrated by way of example and not limitation in the figures of the accompanying drawings in which like references indicate similar elements.

FIG. 1 is a block diagram illustrating a cross section of a touch screen according to some embodiments.

FIGS. 2A-2F are block diagrams illustrating examples of a cross-section view of a touch sensor according to some embodiments.

FIG. 5 is a block diagram illustrating an example of a cross-section view of a touch sensor with a layer of standoff photoresist according to some embodiments.

DETAILED DESCRIPTION

Figure 4:
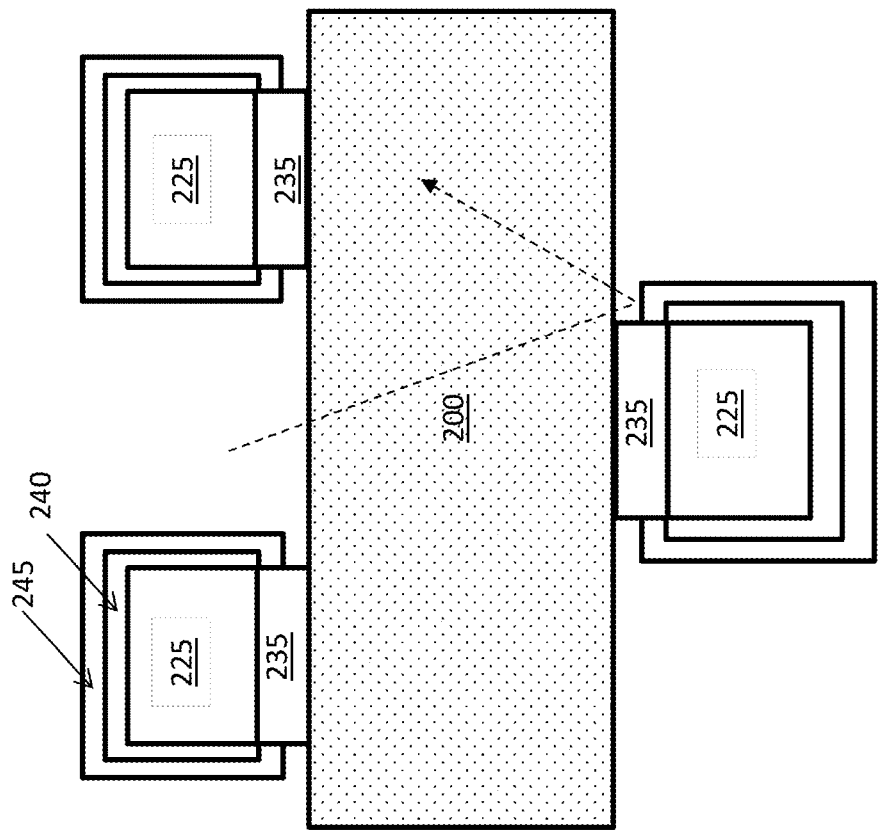
FIG. 4 is a block diagram illustrating an example of a cross sectional view of a touch sensor after photolithography processing and electroless plating according to some embodiments.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

Embodiments of the inventive touch sensor will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

FIG. 1 shows a cross-section of a touch screen 100 which may implement a touch sensor in accordance with embodiments of the present disclosure. Touch screen 100 includes a display device 110 (e.g., LCD, OLED, etc.) and a touch sensor 130 that overlays at least a portion of a viewable area of display device 110. In certain embodiments, an optically clear adhesive ("OCA") or resin 140 may bond a bottom side of touch sensor 130 to a top, or user-facing, side of display device 110. In other embodiments, an isolation layer or air gap 140 may separate the bottom side of touch sensor 130 from the top, or user-facing, side of display device 110. A transparent cover lens 150 may overlay a top, or user-facing, side of touch sensor 130. The transparent cover lens 150 may be composed of polyester, glass, or any other material suitable for use as a cover lens 150. In certain embodiments, an OCA or resin 140 may bond a bottom side of the transparent cover lens 150 to the top, or user-facing, side of touch sensor 130. A top side of transparent cover lens 150 faces the user and protects the underlying components of touch screen 100. Incidentally, in this disclosure the term top or upper refers to the side facing the user when the touch screen is in use, while bottom or lower indicate the direction away from the user.

The components and/or the stack of touch screen 100 may vary based on an application or design in accordance with some embodiments of the present disclosure. The touch sensor 130, or the function that the touch sensor implements, may be integrated into the display device 110 stack (not independently illustrated) in accordance with some embodiments of the present disclosure.

The disclosed features apply to both resistive and capacitive touch screens, and for touch screen utilizing transparent conductors and those utilizing metallic conductors. Both resistive and capacitive touch sensors employ two patterns of conductive material, which may have different pattern designs. For simplicity, we refer herein to general "Manhattan" design or streets and avenues (or rows and columns) wherein each intersection of a street and avenue indicates an "addressable" touch point.

Also, two different types of photoresist are employed in the construction of the touch sensor: a "standard" photoresist (referred to herein simply as "photoresist") and a catalytic photoresist. In fabricating conductive pattern using transparent conductor, e.g., ITO or ATO, a photoresist may be used to delineate the pattern by having the photoresist cover the areas where conductive material (ITO or ATO) should not be deposited upon. After depositing the conductive material, the photoresist is removed. Conversely, when the conductive pattern is made out of metal, such as copper or copper alloy, a catalytic photoresist is used to delineate the pattern, and the metal is deposited over the photoresist, such that the photoresist is not removed after metal deposition and remains a part of the sensor.

Disclosed herein is a method for manufacturing a touch sensor. In some embodiments, a UV absorbing layer is applied to one surface of a transparent substrate prior to depositing the photoresist layer. The UV absorbing layer may be tuned to block the UV frequency from activating the photoresist on the other surface of the substrate.

FIG. 2A is a cross-section illustrating a small part of the sensor during fabrication, according to an embodiment. Specifically, a patterned photoresist 205 is formed on both surfaces of a transparent substrate 200. The photoresist 205 is first deposited over the entire surface of the substrate, then it is exposed to UV light to transfer a pattern design from a mask onto the photoresist layer, and thereafter the photoresist is developed to form the pattern illustrated in FIG. 2A. A transparent conductor, such as ITO or ATO, is then deposited into the exposed areas, as marked by arrows 210.

With respect to the transparent substrate 200, "transparent" may refer to being capable of transmitting a substantial portion of visible light through the substrate which is suitable for a given touch sensor application or design. In some touch sensor applications, "transparent" may refer to transmittance of at least 85% of incident visible light through the substrate. However, other transmittance values may be desirable for other touch sensor applications or designs. In certain embodiments, transparent substrate 200 may be polyethylene terephthalate ("PET"), polyethylene naphthalate ("PEN"), cellulose acetate ("TAC"), cycloaliphatic hydrocarbons ("COP"), polymethylmethacrylates ("PMMA"), polyimide ("PI"), bi-axially-oriented polypropylene ("BOPP"), polyester, polycarbonate, glass, copolymers, blends, or combinations thereof. In other embodiments, transparent substrate 140 may be any other transparent material suitable for use as a touch sensor substrate such as eagle glass, flexible glass, and quartz. The composition of transparent substrate 200 may vary based on an application or design.

The photoresist 205 may include a positive or negative photoresist. In some embodiments, the negative photoresist may be advantageous. In some embodiments, the negative photoresist may be acrylic phenolic polymer. In other embodiments, the negative photoresist may be acrylic, epoxy, urethane, or combinations of one or more of the aforementioned compositions. The negative photoresist may vary in accordance with some embodiments of the present disclosure.

In order to generate the pattern, the photoresist needs to be exposed to UV radiation. However, since substrate 200 is transparent, irradiating the photoresist on one side of the substrate, the UV radiation would also expose the photoresist on the other side of substrate 200. Similarly, in methods where both photoresist layers are exposed simultaneously, each exposure would expose the opposite photoresist as well. Since, as illustrated in FIG. 2A, the design of the pattern is different on each side, exposing the photoresist on one side to radiation meant for the other side is detrimental.

Therefore, according to an embodiment, the substrate 200 is impregnated or formed with a UV blocker material (exemplified by the dot-fill in FIG. 2A). The UV absorber material should be transparent in the visible light spectrum and may be tuned to block the UV frequency used to activate the photoresist. For example, the UV blocker material may be tuned to block radiation in the UVA region of the electromagnetic spectrum, approximately 315-400 nanometers. In addition, the UV blocker material may not impart any color to the transparent substrate 200 that may degrade the optical performance of any display onto which the micro mesh touch sensor is mounted. Absorbers that may be used are molecules for the UV blocker may be, e.g., 2,2Methylenebis[6-(2H-benzotriazol-2-yl-4(1,1,3,3-tetramethylbutyl)phenol],2,2'-phenylene bis-4H-3,1-benzoxazin-4-one, and 2-(4,6-Bis-(2,4-dimethylphenyl)-1,3,5-triazin-2-yl)5-(octyloxy)-phenol. The amount added to the substrate material can range from 0.01 to 4 percent by weight, e.g., with 0.05 to 1 percent by weight.

FIG. 2B is a cross-section illustrating a small part of the sensor during fabrication, according to an embodiment which also solves the unintended exposure problem. Specifically, rather than including a UV blocker material into the substrate 200, a UV blocking layer 215 is formed on one surface of the substrate 200 prior to forming the photoresist layer 205. Notably, forming the blocking layer 215 on only one side is sufficient to protect the photoresist on both sides from unintended radiation. Radiation from the top side in FIG. 2B would expose the top photoresist and would be blocked from reaching the substrate and/or the bottom photoresist. Conversely, radiation from the bottom side in FIG. 2B would expose the bottom photoresist, and would reach the substrate, but then would be blocked by UV blocking layer 215 from exposing the top photoresist.

FIG. 2C is a cross-section illustrating a small part of a sensor during fabrication, according to an embodiment. In this example, metallic lines will be used, rather than transparent conductor. Therefore, in this embodiment a catalytic photoresist having catalytic nanoparticle is used. The catalytic photoresist composition 225 may include a positive or negative photoresist component and a catalyst component that may include catalytic nanoparticles. In some embodiments, the negative photoresist may be advantageous. In some embodiments, the negative photoresist may be acrylic phenolic polymer. In other embodiments, the negative photoresist may be acrylic, epoxy, urethane, or combinations of one or more of the aforementioned compositions. The negative photoresist may vary in accordance with some embodiments of the present disclosure.

The catalytic nanoparticles are suspended in the photoresist in order to form nucleation sites for the electroless deposition of metal, e.g., copper. By having catalyst nanoparticles in the photoresist composition, and then patterning the photoresist, the catalyst nanoparticles will form nucleation sites only over the developed photoresist, so as to form the pattern design. Thus, while in the embodiment of FIG. 2B the conductive lines are formed in areas exposed by the photoresist, in this embodiment the conductive lines are formed on the catalytic photoresist, as shown by arrows 230.

The nanoparticles may be made of, e.g., silver, carbon-coated silver, copper oxide, palladium, etc. In some embodiments, the size of the catalytic nanoparticles may range from 5 to 250 nanometers, for example, the catalytic nanoparticles may have a size of 15-25 nanometers. In some embodiments the nanoparticles may have a metallic core and a carbon coating. The catalytic photoresist is made by dispersing the nanoparticles in photoresist, for example, the photoresist may be an epoxy-based negative resist SU8. The catalytic nanoparticle composition 225 may be applied to the substrate 200 by a number of techniques such as gravure, reverse gravure, slot die, spray, flexographic, or Meyer rod techniques. The catalytic nanoparticle composition 225 after drying and baking may range in thickness from 1 to 100 microns. For example, the catalytic nanoparticle composition 225 may have a thickness of 5 to 25 microns.

In certain embodiments, the catalytic photoresist composition 220 may include negative photoresist component content in a range between approximately 30 percent and approximately 95 percent by weight and catalyst component content in a range between approximately 5 percent and approximately 70 percent by weight. In other embodiments, the catalytic photoresist composition 220 may include negative photoresist component content in a range between approximately 50 percent and approximately 70 percent by weight and catalyst component content in a range between approximately 30 percent and approximately 50 percent by weight.

After application to the substrate 200, the multilayer stack may be exposed to UV radiation. To delineate the pattern for the deposition of the metal lines, the catalytic photoresist needs to be exposed, so as to transfer the different patterns onto the top and bottom patterns. Therefore, according to an embodiment, the substrate 200 is impregnated or formed with a UV blocker material (exemplified by the dot-fill in FIG. 2C). The UV absorber material may be tuned to block the UV frequency used to activate the photoresist. For example, the UV blocker material may be tuned to block radiation in the UVA region of the electromagnetic spectrum, approximately 315-400 nanometers. In addition, the UV blocker material may not impart any color to the transparent substrate 200 that may degrade the optical performance of any display onto which the micro mesh touch sensor is mounted. Absorbers that may be used are molecules for the UV blocker may be, e.g., 2,2Methylenebis[6-(2H-benzotriazol-2-yl-4(1,1,3,3-tetramethylbutyl)phenol],2,2'-phenylene bis-4H-3,1-benzoxazin-4-one, and 2-(4,6-Bis-(2,4-dimethylphenyl)-1,3,5-triazin-2-yl)5-(octyloxy)-phenol. The amount added to the substrate material can range from 0.01 to 4 percent by weight, e.g., with more beneficial results using 0.05 to 1 percent by weight.

FIG. 2D is a cross-section illustrating a small part of the sensor during fabrication, according to an embodiment which also solves the unintended exposure problem. In FIG. 2D a UV blocking layer is formed on one side, prior to forming the patterned catalytic photoresist. Specifically, rather than including a UV blocker material into the substrate 200, a UV blocking layer 215 is formed on one surface of the substrate 200 prior to forming the photoresist layer 205. Notably, forming the blocking layer 215 on only one side is sufficient to protect the photoresist on both sides from unintended radiation. Radiation from the top side in FIG. 2D would expose the top photoresist and would be blocked from reaching the substrate and/or the bottom photoresist. Conversely, radiation from the bottom side in FIG. 2D would expose the bottom photoresist, and would reach the substrate, but then would be blocked by UV blocking layer 215 from exposing the top photoresist.

FIG. 2E illustrates yet another example wherein a standoff layer 235 is formed on the bottom surface of the substrate, prior to forming the catalytic photoresist layer 225. The standoff layer 235 is formed out of standard photoresist and is patterned to the same pattern as the bottom catalytic photoresist. The thickness of the standoff layer 235 can vary from 0.1 to 25 microns. For example, the thickness of the standoff layer 235 may be between 0.5 to 10 microns. The photoresist standoff layer 235 may be applied and processed together with the catalytic photoresist layer 225. The illustration of FIG. 2E shows the photoresist standoff layer 235 and the catalytic photoresist layer 225 after photolithography processing and patterning, according to some embodiments. In FIG. 2E the substrate 200 incorporates a UV blocker material, as disclosed with respect to the embodiments of FIGS. 2A and 2C.

FIG. 2F illustrates yet another example wherein a standoff layer 235 is formed on the bottom surface of the substrate, prior to forming the catalytic photoresist layer 225. The embodiment of FIG. 2F is similar to that of FIG. 2E, except that a standard substrate 200 is used, and a UV blocker layer 215 is formed on one side of the substrate 200.

In any of the disclosed embodiments, the UV absorber layer 215 may be tuned to block the UV frequency used to activate the photoresist. For example, the UV blocker 215 may be tuned to block radiation in the UVA region of the electromagnetic spectrum, approximately 315-400 nanometers. In addition, the UV absorber 215 should be transparent in the visible light spectrum and may not impart any color to the transparent substrate 200 that may degrade the optical performance of any display onto which the micro mesh touch sensor is mounted. Absorbers that may be used are molecules such as 2,2Methylenebis[6-(2H-benzotriazol-2-yl-4(1,1,3,3-tetramethylbutyl)phenol],2,2'-phenylene bis-4H-3,1-benzoxazin-4-one, and 2-(4,6-Bis-(2,4-dimethylphenyl)-1,3,5-triazin-2-yl)5-(octyloxy)-phenol. The amount added to a coating solution can range from 0.01 to 4 percent by weight, e.g., with beneficially 0.05 to 1 percent by weight.

The UV absorber material is added into a masterbatch of polymer binder solvent composition, such as an acrylic, epoxy, urethane, or ester functional material. The coating generally contains between 20-50 percent solids to solvent into which UV absorber is added. In the preferred embodiment the master batch coating composition is comprised of 20-25% solids polymer and 3-4% UV absorber. The coating is subsequently applied to the carrier film of interest, i.e., substrate 200, and the thickness of the coating after drying is greater than 5 microns with 10 to 15 microns being preferred.

Figure 3:
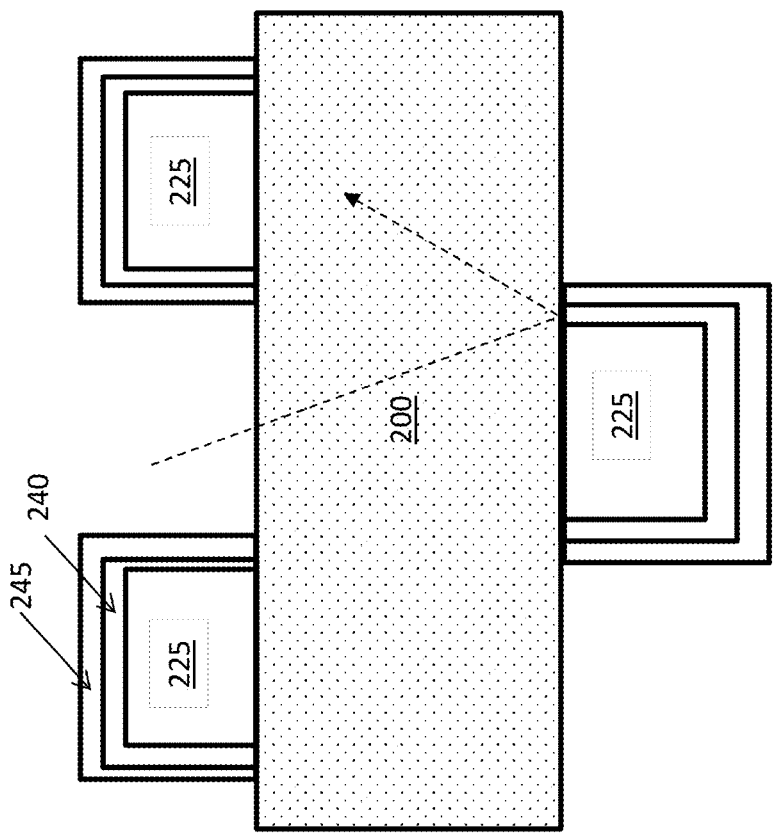
FIG. 3 is a block diagram illustrating an example of a cross-section view of a touch sensor after photolithography processing and electroless plating according to some embodiments.

FIG. 3 is a block diagram illustrating an example of a cross sectional view of a touch sensor after photolithography processing and electroless plating, according to some embodiments. In this embodiment, the transparent substrate 200 incorporates a UV blocker material. After the UV radiation from the external source is applied to the transparent substrate 200, a developer may be applied to the catalytic photoresists composition 225. In some embodiments, the developer may include a water-based alkaline solution. In other embodiments, the developer may include an organic solvent such as, for example, Carbitol™ or Dowanol™. The composition of the developer may vary with the catalytic photoresist composition in accordance with some embodiments of the present disclosure.

The developer may loosen or remove an unexposed portions of the catalytic photoresists composition 225, leaving a catalytic photoresist image of the first conductive pattern on the first side of the transparent substrate 200 and a catalytic photoresist image of the second conductive pattern on the second side of the transparent substrate 200. In certain embodiments, an optional hard bake may be performed on the transparent substrate 200 after development. Hard-bake typically includes heating the transparent substrate 200 to a sufficient temperature for a sufficient amount of time to stabilize and harden the developed catalytic photoresist composition 225 prior to stripping. The temperature and the amount of time required to hard-bake may vary based on the composition and the applied thickness of the catalytic photoresist composition 225. After development, any remaining catalytic photoresist composition 225 not exposed to UV radiation is stripped, leaving catalytic photoresist patterns.

When catalytic nanoparticle photoresist composition 225 is deposited on both sides of the substrate 200 (as illustrated in FIG. 3), the UV radiation incident on a photomask (not shown) may pass through a negative image of a first conductive pattern onto the catalytic photoresist composition 225 disposed on a first side of the transparent substrate 200 and pass through a negative image of a second conductive pattern onto the catalytic photoresist composition 225 disposed on a second side of the transparent substrate 200. The catalytic photoresist patterns in the image of the first conductive pattern is on the first side of the transparent substrate 200, and the catalytic photoresist patterns (not shown) in the image of the second conductive pattern is on the second side of the transparent substrate 200. The blocker material in the substrate 200 prevents UV radiation from one side to affect the catalytic photoresist on the other side of the substrate 200.

As illustrated in FIG. 3, a layer of metal 240 may be plated on the remaining catalytic photoresist composition 225, thereby forming the conductive patterns on the transparent substrate 200. In some embodiments, an electroless plating process may be used to electroless plate a first metal on the catalytic photoresist composition 225. In other embodiments, an immersion bath process may be used to immersion-plate a first metal on the catalytic photoresist composition 225. Other methods of disposing metal on the images of the catalytic photoresist composition 225 may be used as well. The conductive patterns 240 may result in a conductive mesh for the sensor. When a width of the conductive patterns 240 is small, e.g., in microns, the conductive patterns 240 may result in a conductive micro-mesh for the sensor.

In some embodiments, the first metal may be copper. In other embodiments, the first metal may be copper alloy. Other metals or metal alloys may be used as well. In certain embodiments, more than one metal layers may be disposed on the remaining catalytic photoresist composition 225.

In certain embodiments, a metal passivation layer 245, for example, palladium, or a protective coating, may be applied over the metal 240 to protect the metal 240 from corrosion and other environmental failure. The metal passivation layer 245 may impart a dull gray black color that reduces or minimizes reflections from the metal, e.g., copper, plated micro-mesh features. The passivation layer 245 may reduce or minimize any direct or off angle light reflectivity from the metal layer 240, thus further enabling manufacturing of a touch sensor with a low visibility micro-mesh, when applied to an electronic display device.

In some embodiments, the catalytic nanoparticles are formed for light blocking. For example, carbon coated silver nanoparticle suspended in the catalytic photoresist may result in a black non-reflective surface when viewed through the transparent substrate 200. The combination of light-absorbing catalytic nanoparticles (e.g., carbon coated silver nanoparticles) and dark palladium passivation solves the problem of metallic micro-mesh bright light reflectivity and enables an aesthetically pleasing touch sensor.

FIG. 4 is a block diagram illustrating an example of a cross-section view of a touch sensor with a photoresist standoff layer 235, according to some embodiments. The photoresist standoff layer 235 may be deposited on the substrate 200. The catalytic photoresist composition layer 225 may be deposited on the photoresist standoff layer 235. The photoresist standoff layer 235 may be either a positive or negative resist. The thickness of the standoff layer 235 can vary from 0.1 to 25 microns. For example, the thickness of the standoff layer 235 may be between 0.5 to 10 microns. While in FIG. 4 the photoresist standoff layer 235 is applied to both sides of the substrate, it may be applied instead only on the bottom surface of the substrate, i.e., the surface facing away from the user.

The reason for the standoff layer 235 is as follows. Referring to FIG. 3, when light hits the touch screen, it may pass though the substrate and hit the edge of the metal line, as illustrated by the broken-line arrow. The light may then reflect from the edge of the metal line. Conversely, in FIG. 4 the light passing through the substrate cannot hit the edge of the metal line, since it is coated by the passivation layer 245, causing a dull grey reflection that is not visible to the user.

In some embodiments, the substrates 200 may include a UV absorber as a bulk additive. In other embodiments, a UV blocker layer is applied over the substrate. Regardless, the UV blocker material absorption spectrum may be tuned for a selected photosensitive material based on an exposure lamp and optical system specifications. In one embodiment, the photoresist exposure may be processed with conventional near UV (350-400 nm) radiation. This process wavelength range may be well suited to commercially available exposure systems that utilize high pressure mercury arc lamps as the exposure light source. These light sources may have high intensity output in the 365 nm range. Light above 375 nm may easily be filtered using commercially available band pass light filters. Additionally, in one embodiment, the selected photosensitive material may be a negative photoresist that is designed for high mechanical, thermal and chemical stability.

The separate UV blocking layer 215 on the substrate 200 may allow more flexibility in choosing substrate film property such as thickness, birefringence, surface defect level, cost, etc. The UV blocking layer 215 is also important in the sensor design and manufacturability. The UV blocking layer 215 may allow great design freedom to select standard photoresists with other properties that are important such as adhesion, etc. The UV blocking layer 215 further allow better match of a peak output of the exposure lamps for faster expose times and longer lamp life.

FIG. 5 is a block diagram illustrating an example of a cross-section view of a touch sensor according to some embodiments. In the embodiment of FIG. 5, a UV blocker layer 215 is deposited on one side of a standard substrate 200, here on the top surface. Conversely, a standoff layer 235 is deposited on the opposite side of the substrate, here on the bottom surface. Then a catalytic photoresist 225 is deposited on both sides of the substrate, exposed, and developed into two patterns. Metal 240 is deposited over the catalytic photoresist, and passivation layers 245 are formed over the metal.

Figure 6:
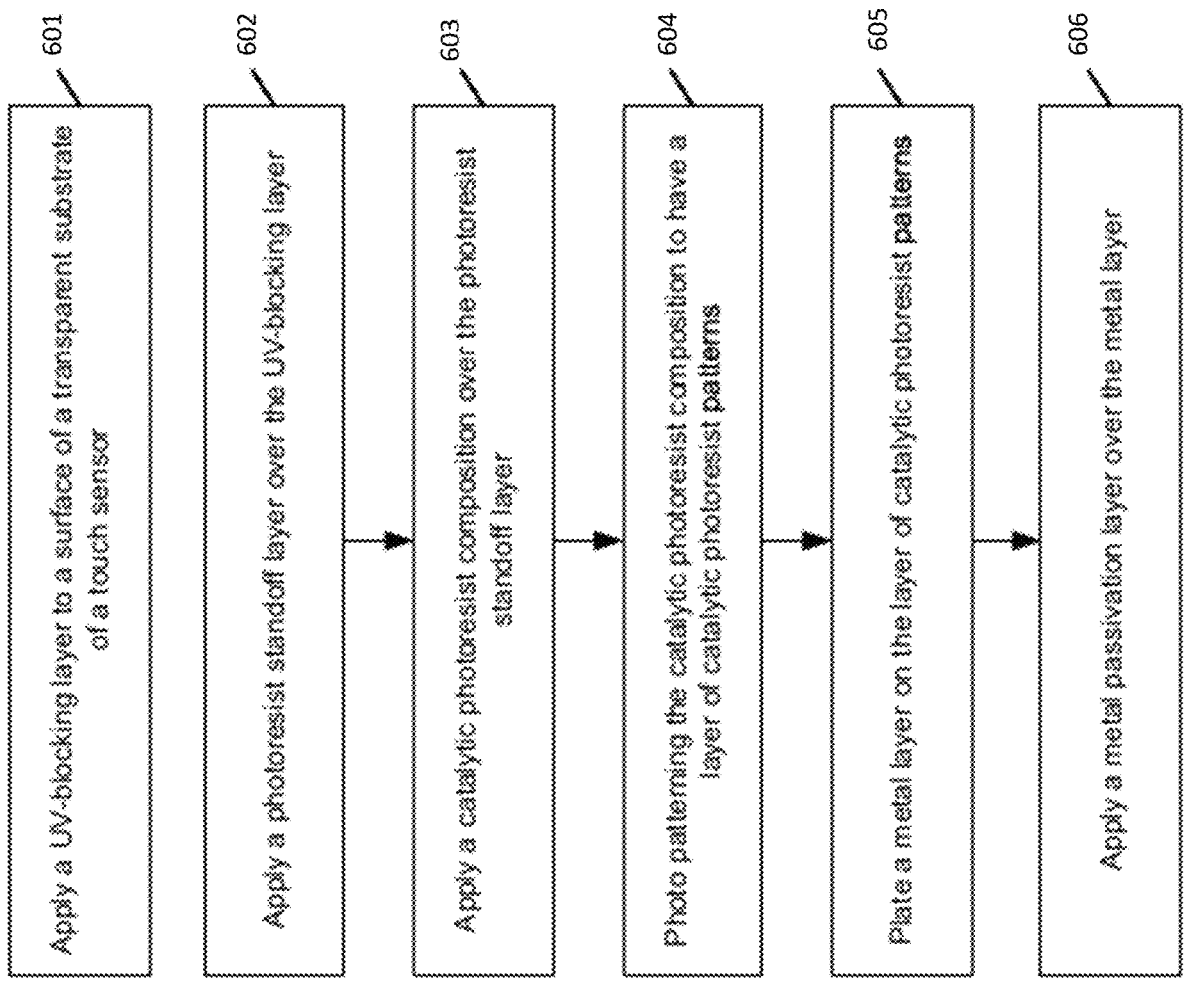
FIG. 6 a flow diagram illustrating an example of a method of manufacturing a touch sensor according to some embodiments.

FIG. 6 is a flow diagram illustrating an example of a method of manufacturing a conductive mesh touch sensor according to some embodiments. The method provides solutions to touch screen applications that require precise alignment of circuits on two sides of a transparent substrate. In this method, a separate UV-blocking layer is applied to one surface of an optically transparent substrate. A photosensitive material may be then applied on the UV-blocking layer on one side and directly on the substrate surface on an opposing side. The UV-blocking layer may be tuned to block the UV frequency from activating the photoresist.

At 601, the UV-blocking layer may be applied to a surface of a transparent substrate of a touch sensor. At 602, a photoresist standoff layer may be applied over the UV-blocking layer or to the surface of the substrate, or both, depending whether a standoff layer is applied to one side or both sides of the substrate. At 603, a catalytic photoresist composition including the photoresist and the catalytic nanoparticles may be applied over the photoresist standoff layer. At 604, the catalytic photoresist composition may be photo patterned to have a layer of catalytic photoresist patterns. At 605, a metal layer may be plated on the layer of catalytic photoresist patterns. At 606, a metal passivation layer may be applied over the metal layer.

Figure 7:
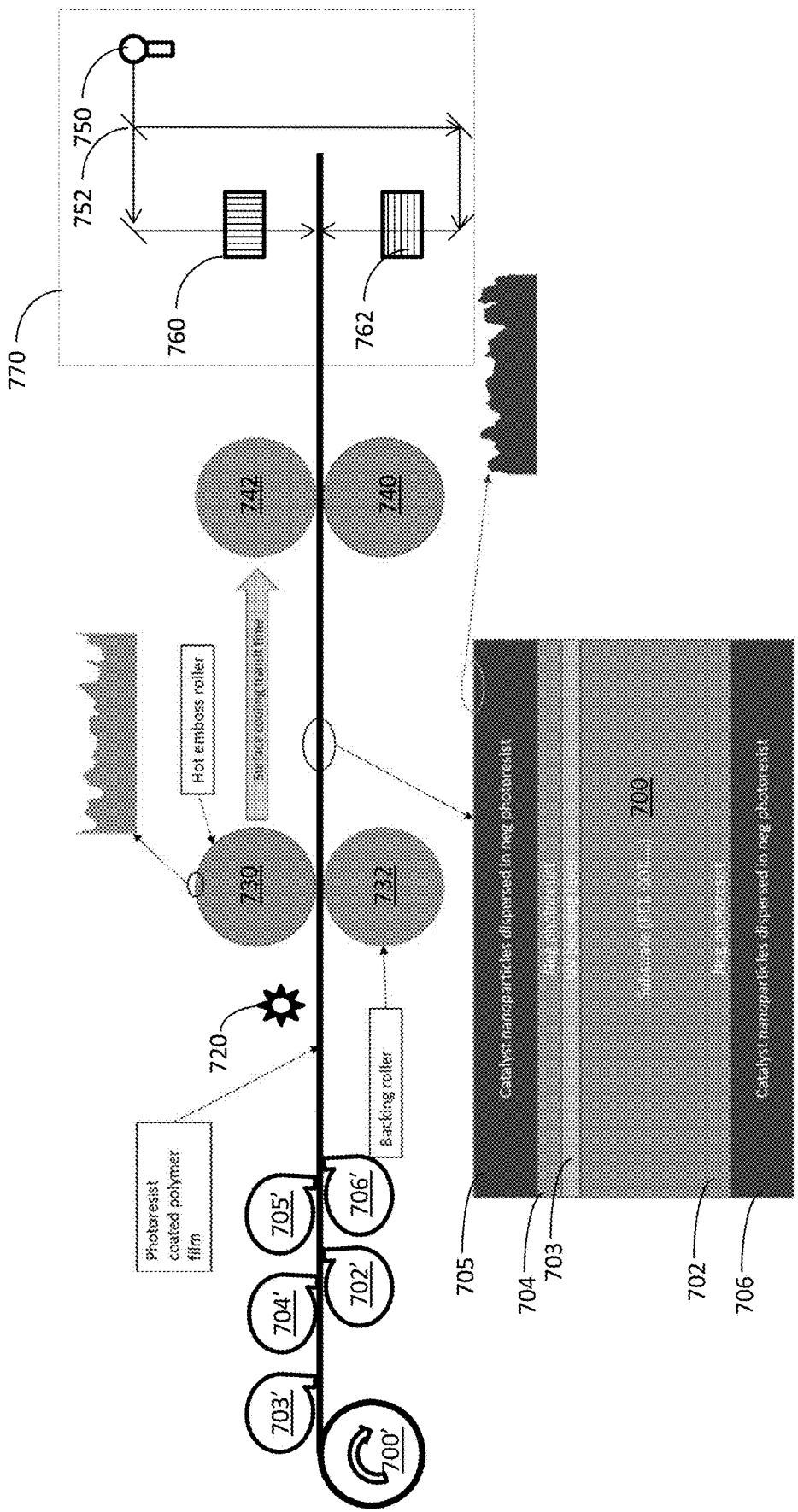
FIG. 7 is a schematic illustrating a roll to roll manufacturing of touch sensors according to embodiments.

In an embodiment, a touch sensor is fabricated on a roll to roll system, while forming metallic wire mesh on both sides of the substrate. The relevant parts of the system are illustrated in FIG. 7. Specifically, the substrate 700 is a continuous roll that is fabricated while transferring from a supply roll 700' to a receiving roll (not shown), and thereafter is cut to separate the multiple sensors fabricated. As shown in the first-level callout, a standard photoresist 702 is deposited on one side of the substrate, here the bottom side. On the opposite side, a UV blocker layer 703 is first deposited and optionally a standard photoresist 704 is deposited over the UV blocker layer 703.

The UV blocker layer 703 is provided in order to enable UV light exposure of the photoresist stacks on either side without affecting the photoresist stack on the other side. This is because the substrate and the photoresist stacks are transparent to UV light, such that UV light incident on one side of the substrate would expose the opposite side as well. However, since the pattern of the mesh on either side of the substrate is different, the UV exposure on each side must pass through a different mask, thereby generating a different pattern on each side of the substrate.

The catalytic photoresist layers 705 and 706 are formed over the standard photoresist 704 and 702, respectively. If needed, a soft bake station 720 may be included in order to evaporate the solvent used during the photoresist deposition process. While in FIG. 7 the soft bake station is illustrated prior to the embossing rollers the soft baking may be performed after the embossing.

In this embodiment, embossing of the photoresist is done in order to generate a roughened or textured metal surface, thereby reducing light reflection towards the user. The substrate is passed through a first roller pair, having hot embossing roller 730 and backing roller 732. As shown in the callout, the surface of the hot embossing roller 730 is roughened, and the roughened texture is embossed onto the catalytic photoresist 705, as shown in the second-level callout. A second roller pair having hot embossed roller 740 and backing roller 742 is placed at a separation distance from the first roller pair sufficient to allow the cooling of the surface embossed by the first roller pair. The second roller pair embosses the opposite side, i.e., catalytic photoresist 706.

In the embodiment illustrated in FIG. 7, both catalytic photoresists are exposed to UV light simultaneously in an exposure station 770. For simplicity, exposure station 770 is illustrated as receiving the substrate film 700 from the same source roller 700'; however, generally exposure station 770 is separate and the substrate film is transferred to the exposure station and may be rolled onto a different source roller 700'. In either case, in the exposure station 770 a UV light source 750 generates a UV light beam. Optical elements 752, e.g., a half mirror, splits the UV light beam into two beams, one directed towards the top of the substrate and one directed towards the bottom of the substrate. One of the beams is passed through pattern mask 760 and transfers the pattern onto the top photoresist stack 704 and 705, while the other beam is passed through the second pattern mask 762 and transfers the pattern onto the bottom photoresist stack 702 and 706.

Thus, a system for fabricating a touch sensor is provided, comprising: a supply roll 700' supporting a roll of flexible substrate film 700; a first deposition station 703' depositing a UV blocker layer 703 over a first surface of the substrate 700; a second deposition station 705' depositing a catalytic photoresist 705 on the first side of the substrate; and a third deposition station 706' depositing catalytic photoresist 706 on a second surface of the substrate 700. Optionally, a fourth deposition station 702' is provided that deposits a standoff photoresist layer on the second side of the substrate. Also optionally, a first roller pair having one emboss roller 730 and one backing roller 732, the emboss roller 730 having roughened surface and positioned to emboss the catalytic photoresist 705 on the first side of the substrate 700; a second roller pair having one emboss roller 740 and one backing roller 742, the emboss roller 740 having roughened surface and positioned to emboss the catalytic photoresist 706 on the second side of the substrate 700. When the embossing rollers are employed, optionally a soft back station 720 is also included.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While the present disclosure has been disclosed in example embodiments, those of ordinary skill in the art will recognize and appreciate that many additions, deletions and modifications to the disclosed embodiments and their variations may be implemented without departing from the scope of the disclosure. A wide range of variations to those implementations and embodiments described herein are possible. Components and/or features may be added, removed, rearranged, or combinations thereof. Similarly, method steps may be added, removed, and/or reordered.

Likewise various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Accordingly, reference herein to a singular item includes the possibility that a plurality of the same item may be present. More specifically, as used herein and in the appended claims, the singular forms "a," "an," "said," and "the" include plural referents unless specifically stated otherwise. In other words, use of the articles allow for "at least one" of the subject item in the description above as well as the claims below.

Additionally as used herein, a phrase referring to "at least one of" a list of items refers to any combination of those items, including single members. As an example, "at least one of: a, b, or c" is intended to cover: a, b, c, a-b, a-c, b-c, and a-b-c.

Certain features that are described in this specification in the context of separate embodiments also can be implemented in combination in a single embodiment. Conversely, various features that are described in the context of a single embodiment also can be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations may be described as occurring in a particular order, this should not be understood as requiring that such operations be performed in the particular order described or in sequential order, or that all described operations be performed, to achieve desirable results. Further, other operations that are not disclosed can be incorporated in the processes that are described herein. For example, one or more additional operations can be performed before, after, simultaneously, or between any of the disclosed operations. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single product or packaged into multiple products. Additionally, other embodiments are within the scope of the following claims. In some cases, the actions recited in the claims can be performed in a different order and still achieve desirable results.

Although the terms "first" and "second" may be used herein to describe various features/elements (including steps), these features/elements should not be limited by these terms, unless the context indicates otherwise. These terms may be used to distinguish one feature/element from another feature/element. Thus, a first feature/element discussed could be termed a second feature/element, and similarly, a second feature/element discussed could be termed a first feature/element without departing from the teachings of the present invention.

The order in which various described method steps are performed may often be changed in alternative embodiments, and in other alternative embodiments one or more method steps may be skipped altogether. Optional features of various device and system embodiments may be included in some embodiments and not in others. Therefore, the foregoing description is provided primarily for exemplary purposes and should not be interpreted to limit the scope of the invention as it is set forth in the claims.

The examples and illustrations included herein show, by way of illustration and not of limitation, specific embodiments in which the subject matter may be practiced. As mentioned, other embodiments may be utilized and derived therefrom, such that structural and logical substitutions and changes may be made without departing from the scope of this disclosure. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A method of manufacturing a touch sensor with conductive lines, comprising:
    applying a UV-blocking layer to a first surface of a transparent substrate, the UV- blocking layer being opaque to UV radiation, the UV-blocking layer is formed by mixing at least one of: 2,2Methylenebis[6-(2 H-benzotriazol-2-yl -4(1,1,3,3-tetramethylbutyl)phenol],2,2'-pphenylenebis-4H-3,1-benzoxazin-4-one, and 2-(4,6-Bis-(2,4-dimethylphenyl)-1,3,5-triazin-2-yl)5-(octyloxy)-phenol, in a polymer binder solvent composition, wherein the polymer binder solvent composition is one of: acrylic, epoxy, urethane, or ester functional material;
    applying a first photoresist layer over the UV-blocking layer;
    applying a second photoresist layer over a second surface of the transparent substrate;
    photo-patterning the first photoresist layer and the second photoresist layer using UV radiation;
    developing the first photoresist layer and the second photoresist layer;
    forming a first metal circuit over the first surface according to pattern formed by the first photoresist layer; and,
    forming a second metal circuit over the second surface according to pattern formed by the second photoresist layer.

2. The method of claim 1, wherein the UV-blocking layer is formed to be opaque in a region of the electromagnetic spectrum of from 315 to 400 nanometers.

3. The method of claim 1, wherein the mixing comprises mixing from 0.01 to 4 percent by weight of UV-blocking material.

4. The method of claim 1, wherein the mixing comprises mixing from 20% to 25% solids polymer and from 3% to 4% UV absorber material.

5. The method of claim 1, wherein the first metal circuit and the second metal circuit are formed of a transparent conductor material.

6. The method of claim 1, wherein the first metal circuit and the second metal circuit are formed of metallic conductor material that is opaque in the visible spectrum.

7. The method of claim 6, wherein the first photoresist layer and the second photoresist layer comprise a catalytic photoresist having catalytic nanoparticles mixed in photoresist material.

8. The method of claim 7, further comprising forming a standoff photoresist layer on the second surface of the transparent substrate prior to applying the second photoresist layer.

9. The method of claim 7, further comprising forming a standoff photoresist layer on the UV-blocking layer prior to applying the first photoresist layer.

10. The method of claim 1, wherein photo-patterning comprises simultaneously exposing the first photoresist layer and the second photoresist layer to UV radiation.

11. The method of claim 1, wherein the UV-blocking layer is formed to have a thickness of at least 5 microns after draying.

12. A method of manufacturing a touch sensor with conductive lines, comprising:
    forming a transparent substrate by mixing a UV-blocking material into a transparent substrate material, the UV-blocking layer being opaque to UV radiation, wherein the UV- blocking layer is formed by mixing at least one of: 2,2Methylenebis[6-(2H-benzotriazol-2-yl-4(1,1,3,3-tetramethylbutyl)phenol],2,2'-pphenylenebis-4H-3,1-benzoxazin-4-one, and 2-(4,6-Bis-(2,4-dimethylphenyl) -1,3,5-triazin-2-yl)5-(octyloxy)-phenol, in a polymer binder solvent composition, wherein the polymer binder solvent composition is one of: acrylic, epoxy, urethane, or ester functional material;
    applying a first photoresist layer over a first surface of the transparent substrate;
    applying a second photoresist layer over a second surface of the transparent substrate;
    photo-patterning the first photoresist layer and the second photoresist layer using UV radiation;
    developing the first photoresist layer and the second photoresist layer;
    forming a first metal circuit over the first surface according to pattern formed by the first photoresist layer; and,
    forming a second metal circuit over the second surface according to pattern formed by the second photoresist layer.

13. The method of claim 12, wherein the transparent substrate material comprises one of: polyethylene terephthalate ("PET"), polyethylene naphthalate ("PEN"), cellulose acetate ("TAC"), cycloaliphatic hydrocarbons ("COP"), polymethylmethacrylates ("PMMA"), polyimide ("PI"), bi-axially-oriented polypropylene ("BOPP").

14. A touch sensor for a touch screen, comprising:
a transparent substrate;
a UV-blocking layer on a first surface of the transparent substrate, wherein the UV- blocking layer is formed by mixing at least one of: 2,2Methylenebis[6-(2H-benzo-triazol-2-yl-4(1,1,3,3-tetramethylbutyl)phenol],2,2'-pphenylenebis-4H -3,1-benzoxazin-4-one, and 2-(4,6-Bis-(2,4-dimethylphenyl)-1,3,5-triazin-2-yl)5-(octyloxy)-phenol, in a polymer binder solvent composition, wherein the polymer binder solvent composition is one of: acrylic, epoxy, urethane, or ester functional material;
a first conductive circuit over the first surface according to a first pattern; and,
a second conductive circuit over a second surface of the transparent substrate according to a second pattern different from the first pattern.

15. The touch sensor of claim 14, wherein the first conductive circuit and the second conductive circuit comprise transparent conductor material.

16. The touch sensor of claim 14, further comprising:
a first catalytic photoresist layer over the UV-blocking layer;
a second catalytic photoresist layer over the second surface of the transparent substrate;
wherein the first conductive circuit comprises metal deposited over the first catalytic photoresist layer, and the second conductive circuit comprises metal deposited over the second catalytic photoresist layer, wherein the metal is opaque to visible light.

17. The touch sensor of claim 14, wherein the UV-blocking layer has a thickness of from 10 to 15 microns.

* * * * *